United States Patent [19]
Lee et al.

[11] Patent Number: 6,091,318
[45] Date of Patent: Jul. 18, 2000

[54] INTEGRAL BUMP TECHNOLOGY SENSE RESISTOR

[75] Inventors: Robert D. Lee, Denton; Gary V. Zanders, Fairview; James Walling, Frisco; Steven N. Hass, Carrollton, all of Tex.

[73] Assignee: Dallas Semiconductor Corporation, Dallas, Tex.

[21] Appl. No.: 09/337,960

[22] Filed: Jun. 22, 1999

[51] Int. Cl.[7] .................................................. H01L 1/012
[52] U.S. Cl. ......................... 338/309; 307/322; 361/763; 361/811; 257/684; 257/724
[58] Field of Search .................... 388/307, 309, 388/315, 322, 327; 361/763, 811; 257/684, 924, 536, 537

[56] References Cited

U.S. PATENT DOCUMENTS

| | | | |
|---|---|---|---|
| 3,654,580 | 4/1972 | Laisi | 338/307 |
| 4,019,168 | 4/1977 | Collins | 338/309 |
| 4,738,871 | 4/1988 | Watanabe et al. | 338/309 |
| 5,485,138 | 1/1996 | Morris | 338/307 |
| 5,654,676 | 8/1997 | Avanic et al. | 361/763 |
| 5,712,613 | 1/1998 | Bunkner et al. | 338/307 |
| 5,729,438 | 3/1998 | Pieper et al. | 361/763 |

FOREIGN PATENT DOCUMENTS 3-190144  8/1991  Japan ..................................... 361/811

*Primary Examiner*—Karl Easthom
*Attorney, Agent, or Firm*—Jenkens & Gilchrist, A Professional Corporation

[57] ABSTRACT

A metalization layer formed as part of a bump connection/flip chip process for a semiconductor circuit is also used to form a sense resistor or other passive components. The metalization layers normal composition can also be altered so as to change or control the value of the so formed resistor or to improve the temperature stability of the resistor. Other passive components such as capacitors or inductor can also be formed in this layer.

10 Claims, 5 Drawing Sheets

INTEGRAL BUMP TECHNOLOGY SENSE RESISTOR

BACKGROUND OF THE INVENTION

1. Field of the Invention

The present invention relates generally to an improved apparatus and method for forming a sense resistor that is useful in an IC. As an example a current sense resistor is used in battery management circuits to determine the amount of current being supplied either to or from a rechargeable battery.

2. Description of the Related Art

Various types and mechanism for providing sense resistors have been known. For example an external resistor can be soldered on the board next to a packaged integrated circuit. This however requires several extra manufacturing steps and is inefficient.

Alternatively, the lead frame that the IC is attached to can be formed in such a manner so that a portion of the lead frame can be used as the sense resistor. An example of this is Smith et al., U.S. Pat. No. 5,534,788 which is incorporated by reference herein. As noted in Smith et al. a sense resistor having a low resistance is needed for measuring for cell current in a rechargeable battery pack for instance without affecting device operations. The Smith et al. system cuts down somewhat on the bulk of this resistor and cuts to some extent manufacturing costs of the individual circuits by including as part of the lead frame a sense resistor.

The inclusion of a sense resistor in the lead frame as proposed by Smith et. al has problems however, for several reasons. Particularly the requirement for specialized lead frames is costly. If the die layout or size changes a new customized lead frame must be manufactured requiring either a new stamping or a new cut out to produce this customized lead frame. If a etched lead frame is used this is also expensive and time consuming. It is difficult in the Smith et al. method to have a generic "one size fits all" lead frame.

Further the use of a lead frame itself takes up additional space that is not needed in many semiconductor applications.

SUMMARY OF THE INVENTION

The present invention overcomes the shortcoming and deficiencies noted above by providing a new way of forming the sense resistor for an IC. Specifically the sense resistor is formed using bump or flip chip technology. Particularly useful in this regard is what is known as Double Layer Redistribution Bumping. In this process an integrated circuit is formed by conventional methods and then instead of being bonded to a lead frame the wafer is further processed to provide generally redistributed "solder" bumps that act as the connection point for the integrated circuit. The redistribution is accomplished by forming a metalization layer in the form of the redistributed interconnect points. It is during this metalization layer formation that a sense resistor for the integrated circuit can also be formed. The formation of the resistor in this manner eliminates the need for forming the resistor as part of the lead frame and in fact the entire device can be inserted into a completed system without the need for a lead frame, although a conventional lead frame can be employed if needed. The use of a bump connection allows for smaller resultant circuits.

Further as the process used to pattern the metalization layer are basic semiconductor fabrication techniques with a high degree of accuracy the ohmic value of the resistor can be regulated with a great deal of tolerance. Any out of tolerance of the resistor is kept within a range that can be easily handled by adjusting the sensitivity of the circuit which uses the sense resistor. For, example in the case of a battery management circuit, the battery management circuit of FIG. 1 which for example could be the proposed Dallas Semiconductor DS2447 or other various Dallas Semiconductor Battery Management devices which can except an "out of value" tolerance in the range of 10 to 20% without any difficulty by adjusting later in the manufacturing process a conversion factor within the circuit itself.

An additional value of this method is that any change in the circuit which causes a change in die size or layout only requires a simple mask change for the metalization layer in which the sense resistor is formed. This increases the flexibility of the design process and speeds up the design of new devices An additional feature is that if a lead frame is still desired, the sense resistor is contained within the finished circuit and a specialized lead frame such as is use in Smith et al. is not required. The resultant circuit with the sense resistor internal to the "flip chip" can be attached to a conventional lead frame which allows for a greater flexibility of the design.

BRIEF DESCRIPTION OF THE DRAWINGS

Other advantages and novel features of the present invention can be understood and appreciated by reference to the following detailed description of the invention, taken in conjunction with the accompanying drawings in which.

DETAILED DESCRIPTION OF THE INVENTION

Figure 1:
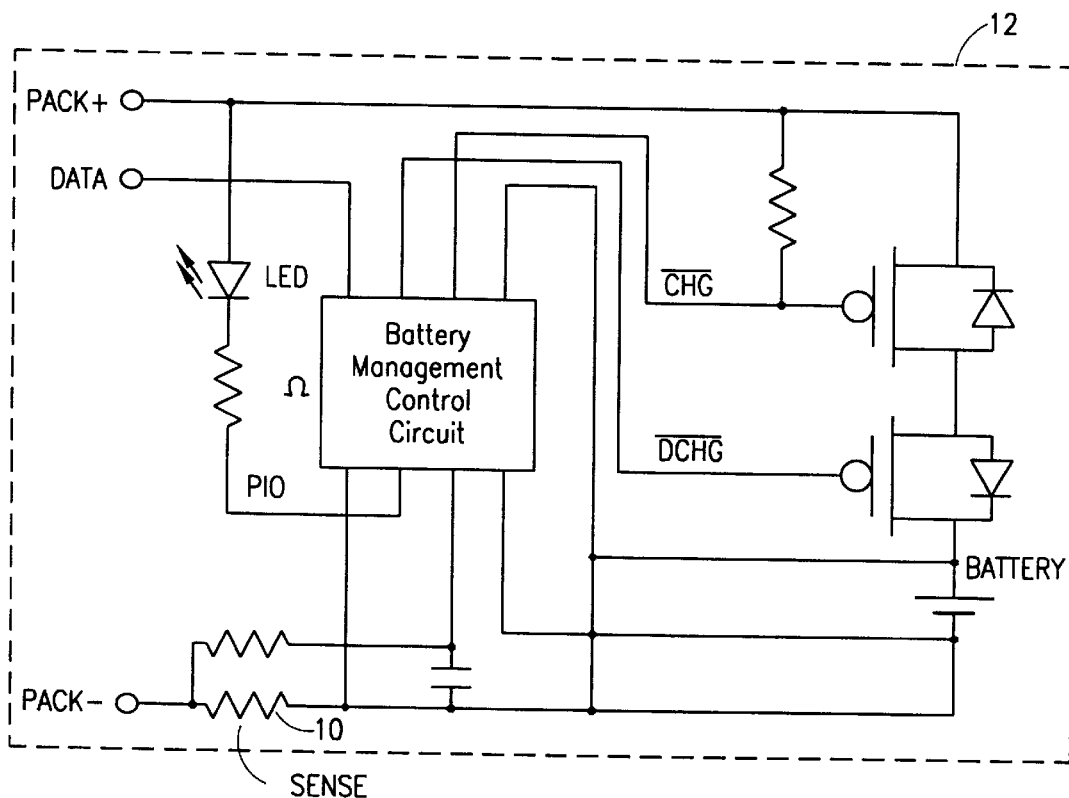
FIG. 1, is an exemplary circuit that uses a sense resistor.

Referring now to the drawings wherein like or similar elements are designated with identical reference numerals throughout the several views, and wherein the various elements are depicted in block form and, in particular, to As can be seen from FIG. 1 a sense resistor 10 would be employed as part of the complete circuit when a battery management circuit such as is identified by 12 is employed. This low resistance sense resistor 10 as noted above has previously been implemented by an external resistor. It has been proposed to use a lead frame portion to form this resistor by Smith et al., however as noted above the use of a lead frame causes both design and implementation problems. The implementation problems are primarily space related although other considerations also make this approach less than satisfactory.

Figure 2:
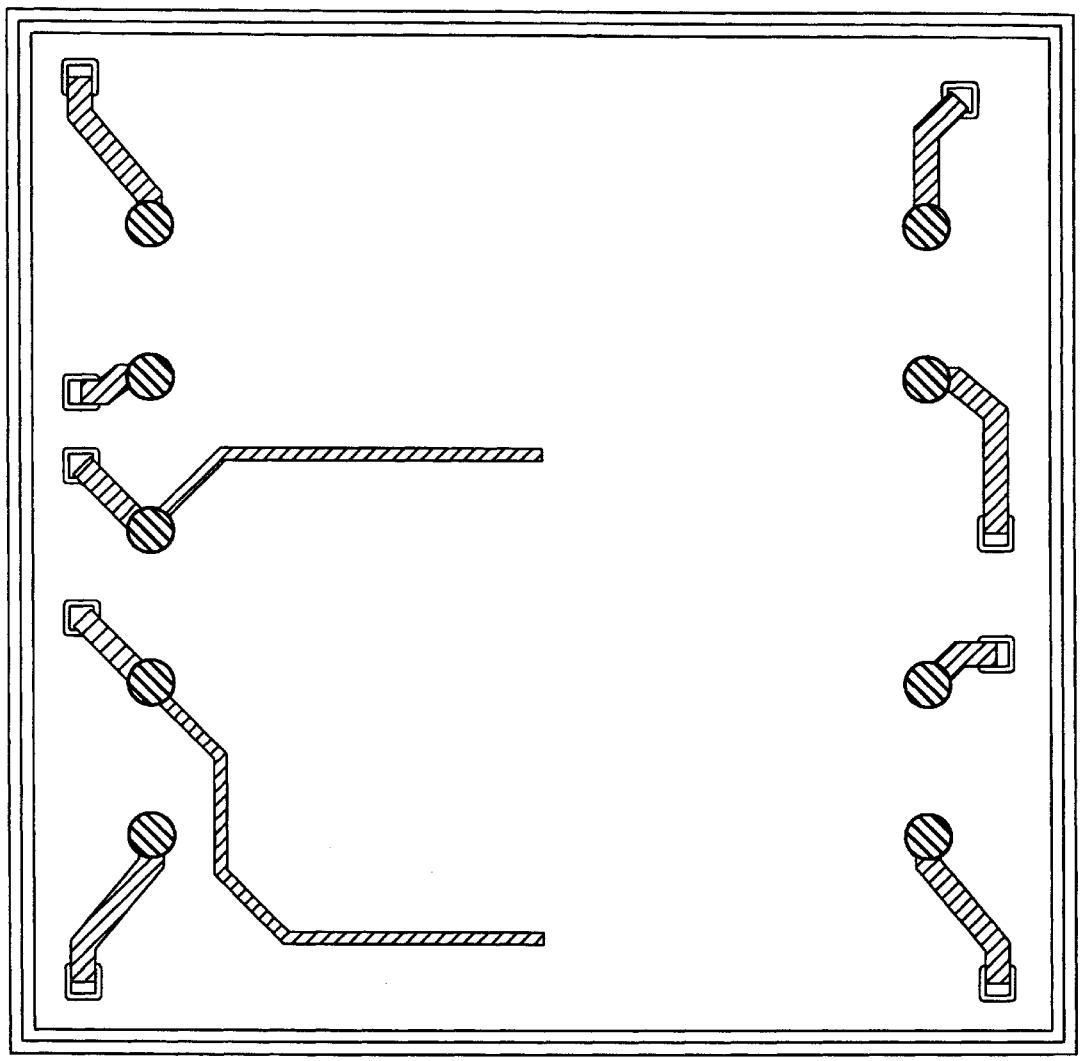
FIG. 2 shows the layout of a bump technology redistribution connections on a semiconductor die.
Figure 3:
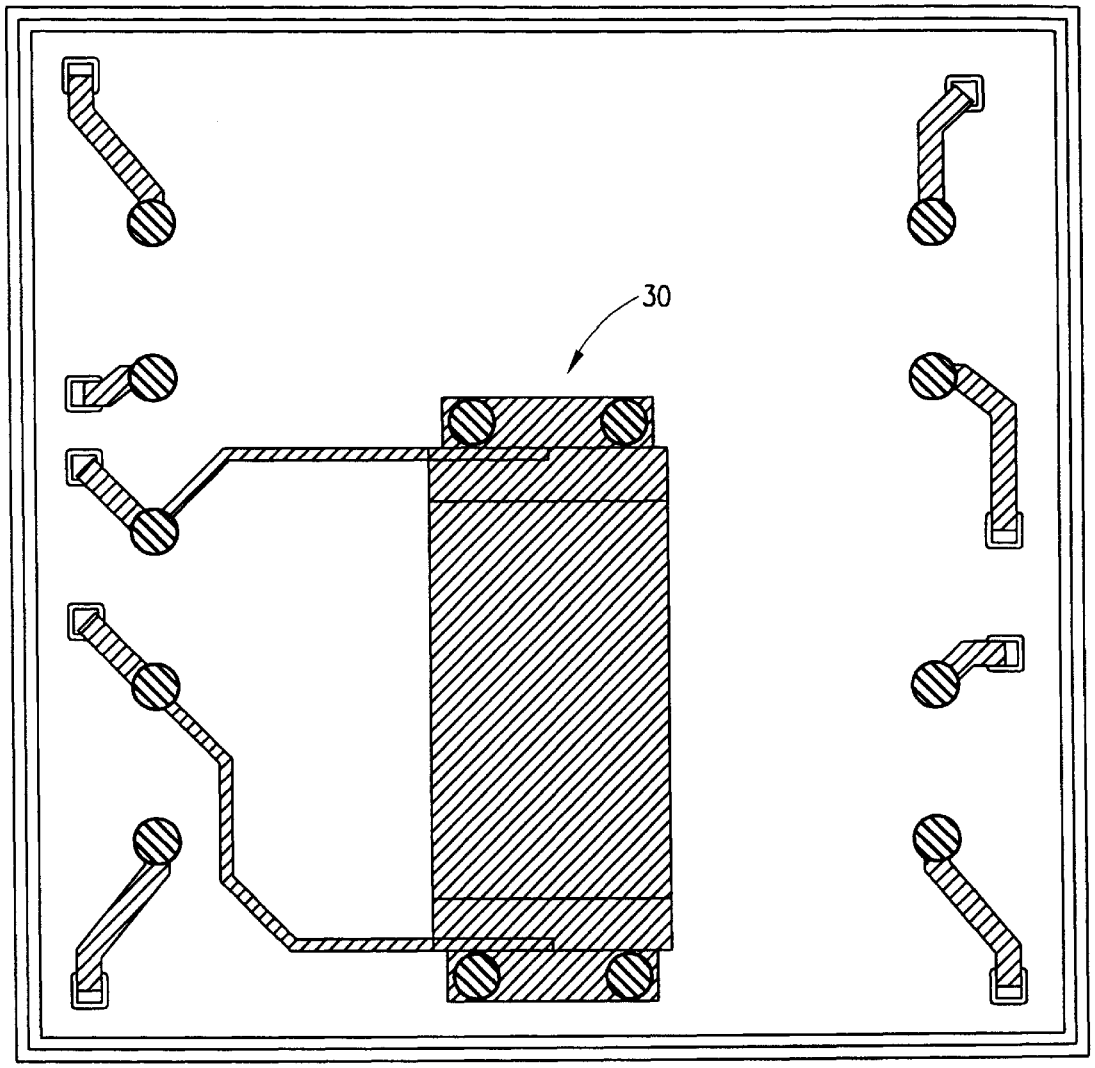
FIGS. 3–5 show a layout of various sense resistors according to an embodiment of this invention.

In FIG. 2 a layout of a redistribution of contacts using bump or flip chip technology is shown. This redistribution can be accomplished by known bump/flip chip manufacturing techniques such as is shown in Yung U.S. Pat. Nos. 5,293,006 and 5,162,257 or Reisman et al. U.S. Pat. No. 5,112,439 which are all incorporated by reference herein. By employing a similar methodology as is used to form the redistributed contacts as in FIG. 2 it is possible to form a sense resistor 30 such that the layout that will result is shown in FIG. 3.

The resistor, ideally will be formed as a rectangular area on the metalization layer and will have a resistance of about 1 to 500 milliohms. A convenient value of this resistance for some applications would be 30 milliohmn which can be accomplished when the metalization layer is 20 KÅ thick (2μ) thick, the length is 80 mils and the width is 40 mils of the resistor. This can be calculated as $$R = \frac{L}{\sigma A} = \frac{L}{\sigma tW} = K\frac{L}{W}$$

where A is the cross sectional area (w is width and t is the thickness of the layer) and K is the sheet resistance per square L is the length of the resistor and σ is the conductivity. If a greater current carrying capacity is needed the resistor can be altered by changing the cross sectional area and the length of the section. In other words the resistor can be enlarged without changing the resistance of the resistor. With the dimensions as stated above this resistor is believed to be able to carry 2 amps. For example if the layer of metal is about 20 KÅ thick (2μ) it can carry about 2 mA/μ the width. It should be noted that a common range of values for thickness of this layer run from 5 KÅ–20 KÅ At 20 KÅ, to carry 2A, this means the resistor would then be approximately 1000μ wide, or 40 mils wide. A normal metal layer as used in the most common process runs about 15 milliohm per square, so if 2 squares are used there will be provided a resistor of approximately 30 milliohms. The total surface area of resistor is then about 40 mils×80 mils. However, in a normal metalization aluminum is used and although this can provided very satisfactory results, it has been concluded that a mixture of nickel and chromium as the metalization layer may provide better thermal resistance stability while still providing very good interconnect functionality. That is to say a metalization layer of nichrome in a 60/40 or 80/20 ratio exhibits a more stable resistance value over a wider range of temperatures.

A significant advantage of this method is that the so formed resistor is formed as part of the IC during manufacturing so that any trimming can be done at the factory, thereby enhancing the utility of the completed device. Also, by having the resistor formed as part of the same package and not external thereto, thermal changes are kept to a minimum. Further a change in the size or placement of the resistor only requires a mask change whereas a change in a lead frame style resistor would require retooling of the lead frame itself. This would cause unacceptable delays in changing product designs.

Figure 4:
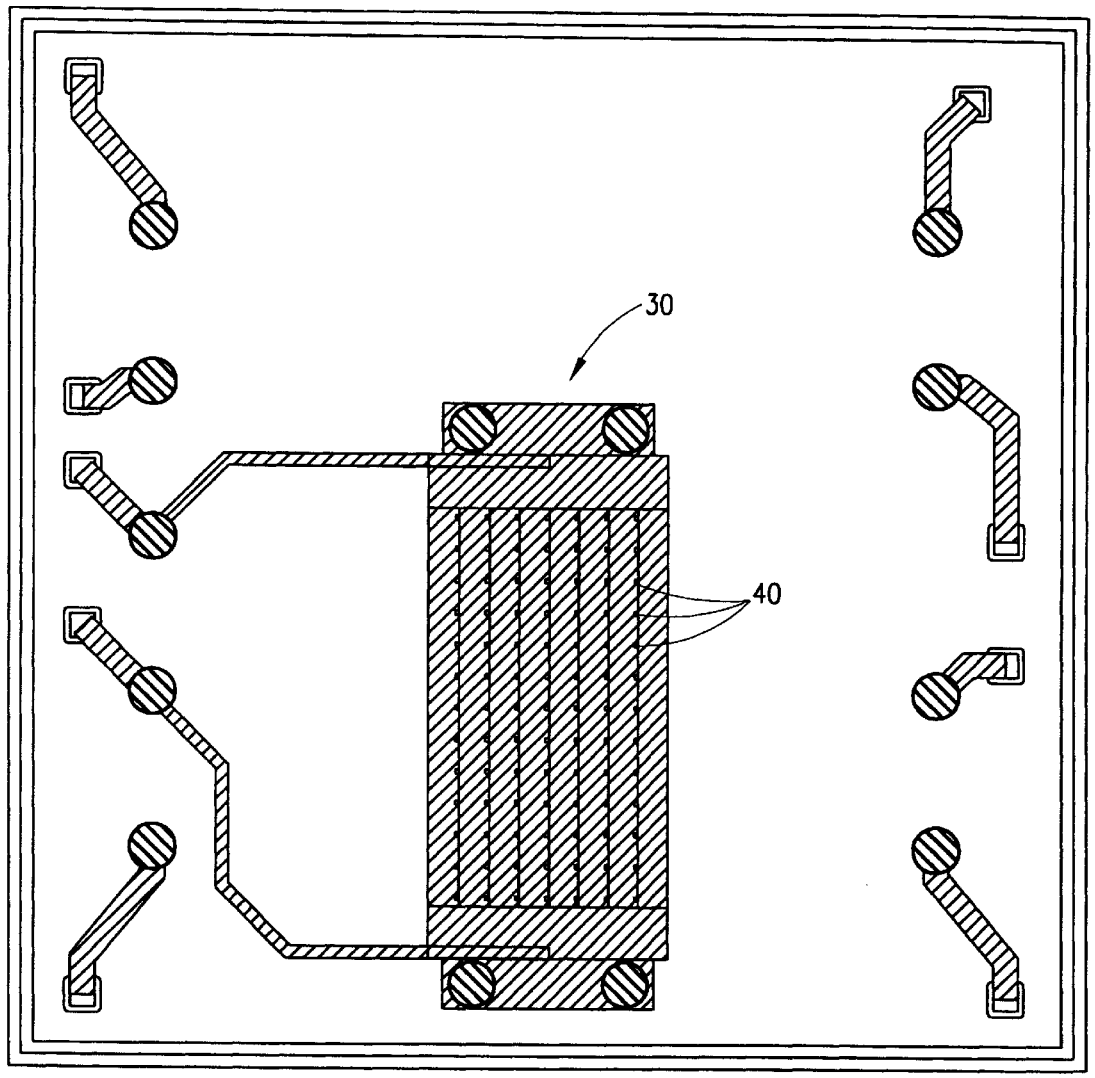
Figure 5:
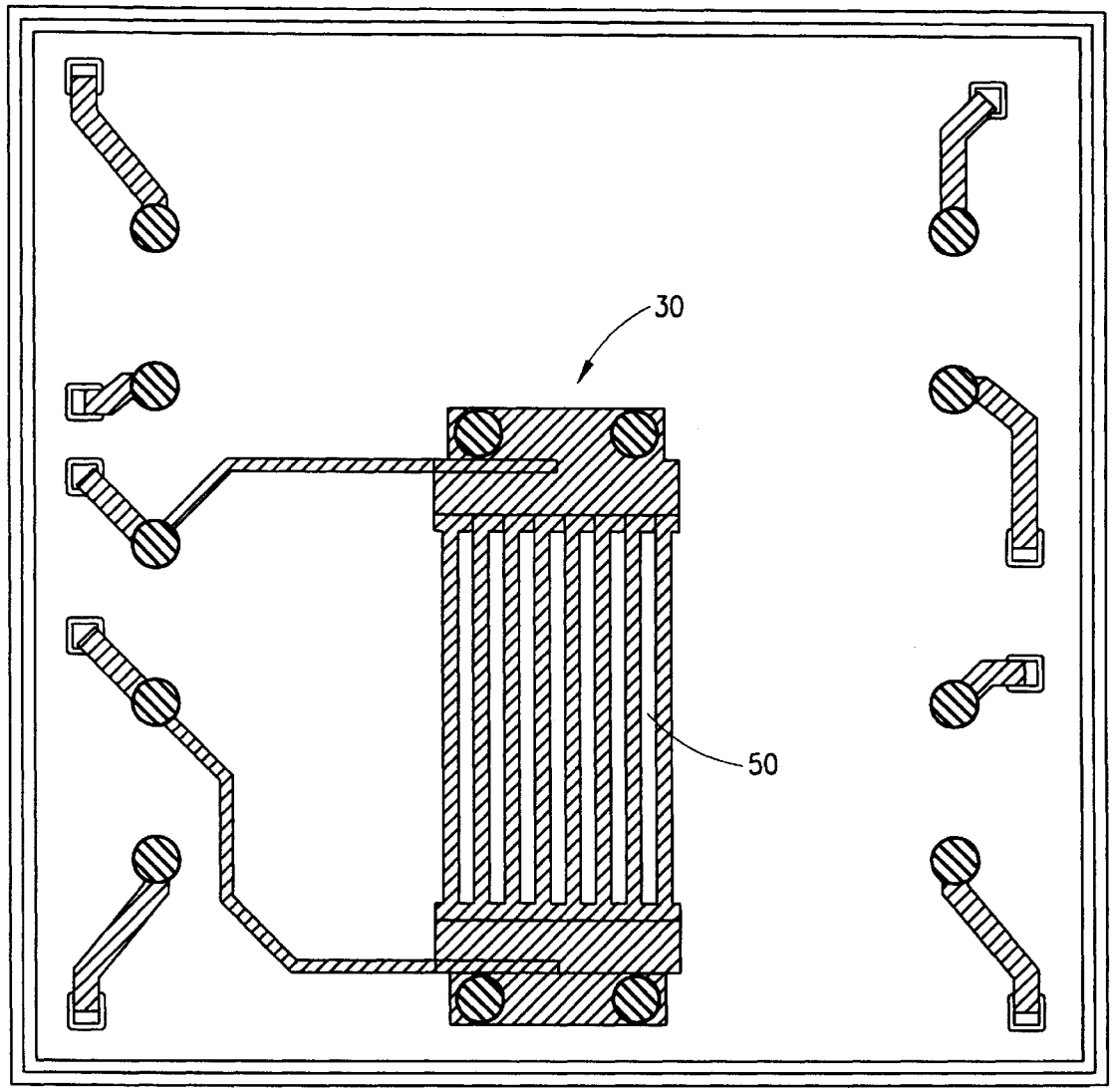

As noted in FIGS. 4–5 various modifications to the resistor 10 can be made. For example, as shown in FIG. 4 the resistor can be formed with deliberately placed small holes 40 distributed along it surface. These holes can help provide additional adhesion of the "bump" metalization layer to the circuit die below. Alternatively, as shown in FIG. 5 the resistor can be formed with open areas 50 that are strips which help not only the adhesion but also flexibility in layout of the completed resistor. Additionally even though FIGS. 3–5 show only "bump" connection points for the actual circuit below and the sense resistor, "dummy" bump points may be provided for added mechanical stability of the completed die and the bump layer. Also, other types of passive elements besides a resistor could be formed in this bump metalization layer such as inductors or capacitors.

Obviously, numerous modifications and variations are possible in view of the teachings above. For example, multiple sense resistors if needed can be formed in the layer. The resultant flip chip can then be attached to conventional lead frames or other types of packaging, but with the sense resistor being incorporated into the IC die. This inclusion could be done by only forming the resistor in the metalization layer without the redistribution function being provided by the metal layer. Also, the sense resistor formed by the aforementioned methodologies can be used in circuits other than battery management.

Accordingly, the present invention is not limited by the embodiments disclosed, but is capable of numerous rearrangements, modifications, and substitutions, without departing from the spirit and scope of the invention as set forth and defined by the following claims.

What is claimed is:

1. An integrated circuit having sensing capabilities comprising;

an active integrated circuit;

a redistribution metalization layer formed directly on one surface of said active integrated circuit;

a sensing element formed in and integral to said redistribution metalization layer wherein said sensing element comprises:

a low resistance current path formed such that said low resistance path which is integral to said metalization layer forms a resistor that is connected via one side of the resistor at two distinct resistance defining points to the integrated circuit for sensing current, wherein said metalization layer also provides interconnection points from the integrated circuit to at least one other circuit such that solder bumps may be operatively associated with said metalization layer on the other side from the connection side of said low resistance path to the integrated circuit.

2. An integrated circuit as in claim 1 wherein said metalization layer is greater than 5 KÅ thick.

3. An integrated circuit as in claim 1 wherein the low resistance current path is substantially rectangular in shape.

4. An integrated circuit as in claim 1 wherein the surface area of the resistor forming the sensing element is formed with holes therein.

5. An integrated circuit as in claim 1 wherein the surface area of the resistor is formed as a series of strips.

6. An integrated circuit as in claim 1 wherein said metalization layer comprises aluminum.

7. An integrated circuit as in claim 1 wherein said metalization layer comprises:

a nickel chromium alloy.

8. An integrated circuit as in claim 7 wherein said nickel chromium alloy is a 60/40 alloy.

9. An integrated circuit as in claim 7 wherein said nickel chromium alloy is an 80/20 alloy.

10. An integrated circuit as in claim 1 wherein:

said metalization layer further has deposited on the side opposite the integrated circuit solder bumps for completing the contact from the integrated circuit upon which the metalization layer is directly deposited on to another device other than the integrated circuit upon which said metalization layer has been formed.

* * * * *

UNITED STATES PATENT AND TRADEMARK OFFICE
CERTIFICATE OF CORRECTION

PATENT NO.    : 6,091,318
DATED         : July 18, 2000
INVENTOR(S)   : Lee et al.

It is certified that error appears in the above-identified patent and that said Letters Patent is hereby corrected as shown below:

Column 3,
Line 47, please add the following:
-- As seen in Fig. 3, the traces of Fig. 2 connect to two distinct points of the resistor at the top and bottom thereof to define the resistance therebetween, and the traces extend to the integrated circuit on the other side of the die surface having the metalization layer thereon, to connect to an active integrated circuit such as in Fig. 1 for sensing current. --

Column 4,
Line 24, replace "comprises:" with -- comprises; --

Signed and Sealed this

Twenty-first Day of January, 2003

JAMES E. ROGAN
*Director of the United States Patent and Trademark Office*